United States Patent [19]

Vogel et al.

[11] Patent Number: 5,395,734
[45] Date of Patent: Mar. 7, 1995

[54] SHOOT AND RUN PRINTING MATERIALS

[75] Inventors: Dennis E. Vogel, Lake Elmo; Leonard J. Stulc, Shafer, both of Minn.

[73] Assignee: Minnesota Mining and Manufacturing Company, St. Paul, Minn.

[21] Appl. No.: 983,124

[22] Filed: Nov. 30, 1992

[51] Int. Cl.$^6$ .................... G03F 7/021; G03C 1/77
[52] U.S. Cl. .................... 430/270; 430/157; 430/176; 430/302; 430/330; 522/30; 522/127
[58] Field of Search ............ 430/270, 302, 176, 157, 430/330; 522/30, 127

[56] References Cited

U.S. PATENT DOCUMENTS

| | | | |
|---|---|---|---|
| 4,328,346 | 5/1982 | Chung et al. | 522/25 |
| 5,024,916 | 6/1991 | Steinmann | 430/270 |
| 5,077,174 | 12/1991 | Bauer et al. | 430/270 |
| 5,102,771 | 4/1992 | Vogel et al. | 430/270 |
| 5,210,003 | 5/1993 | Schädeli | 430/270 |

*Primary Examiner*—Charles L. Bowers, Jr.
*Assistant Examiner*—John S. Chu
*Attorney, Agent, or Firm*—Gary L. Griswold; Walter N. Kirn; Susan Moeller Zerull

[57] ABSTRACT

Acid-sensitive polymers and imageable articles employing them are disclosed. In particular, photosensitive compositions are disclosed comprising: (a) a photoinitiator which generates an acid upon exposure to radiation; and (b) a polymer having acid labile groups pendant from the polymer backbone, said acid labile pendant groups comprising at least one each of A and B wherein A has the formula $-T-(C=O)OCR^1R^2OR^3$, and B has the formula $-T-(C=O)OR^4Si(R^5)_3$, wherein $R^1$ and $R^2$ each represent H or an alkyl group with the proviso that at least one of $R^1$ and $R^2$ must be hydrogen; $R^3$ represents an alkyl group; or any two of $R^1$, $R^2$, and $R^3$ may together form a ring group having from 3 to 36 carbon atoms; $R^5$ represents an alkyl group, aryl group, an alkoxy group, an aryloxy group, an acyloxy group, or a trialkylsiloxy group; and $R^4$ and T represents a divalent linking group wherein T is bonded to the polymer backbone and $R^4$ is not bonded to the polymer backbone, the divalent linking group containing a total of from 0 (a covalent bond) or 1 to 18 carbon atoms where up to one of each three carbon atoms may be replaced by oxygen, nitrogen, or sulfur atoms or combinations thereof in the polymer backbone.

8 Claims, No Drawings

SHOOT AND RUN PRINTING MATERIALS

FIELD OF THE INVENTION

This invention relates to photosensitive compositions. It also relates to imageable articles containing novel photosensitive compositions.

BACKGROUND OF THE INVENTION

Lithographic processes generally employ at least two steps to prepare a plate for use in a printing press, namely 1) exposure of a plate coated with a photosensitive composition to a light source to create a photoimage and 2) a subsequent development step. Typically, the development step involves washing away material from the plate with the aid of a developer solution which may be highly alkaline (e.g., pH of 13), and/or based on an organic solvent. Alternatively, heating has sometimes been employed to effect development of the photoimage.

Both of the above-described development processes can suffer from the drawbacks of being relatively time-consuming and expensive. Furthermore, when volatile organic or strongly alkaline developer solutions are used, their disposal presents an environmental problem.

What is needed in the industry are photosensitive compositions which do not have the above-described drawbacks.

A variety of different materials have been used in photosensitive compositions in the past. Photosensitive compositions employing polymers with pendant acid sensitive moieties have been described in the art (Ito, H.; Ueda, M. *Macromolecules* 1988, 21, 1475–82). o-Nitrobenzyl substituted polyacrylates have been described in U.S. Pat. No. 3,849,137. t-Butyl substituted polyacrylates have also been reported (Ito, H.; Willson, C. G. in Proc. SPIE-Int. Soc. Opt. Eng. 1987, 771, 24; and U.S. Pat. No. 4,491,628).

U.S. Pat. No. 4,963,463 claims a radiation sensitive resin composition comprising an alkali-soluble resin, an o-quinone diazide, an acid-sensitive esters of nitrobenzyl or cyanobenzyl alcohol.

End-capped polyphthalaldehyde has been employed in imaging systems in combination with 'onium salts which were used as a source of photogenerated acid (Ito, H.; Willson, C. G. *Polym. Eng. Sci.* 1983, 23, 1013). Photoresists based on thermal polycarbonate degradation in the presence of photogenerated acid have also been described (Frechet, J. M. J.; Bouchard, F.; Houlihan, F. M.; Kryczka, B.; Eichler, E.; Clecak, N.; Willson, C. G. *J. Imag. Sci.* 1986, 30, 59). Both of these systems function by cleavage of the polymer backbone.

Canadian Patent No. 672,947 describes protective films comprising copolymers of tetrahydropyran-2-yl acrylates, and glycidyl esters of acrylates. Those films are thermally processed, thereby effecting cleavage of the tetrahydropyran-2-yl groups, and subsequently causing cross-linking of the carboxylic acid and the epoxy residues.

Benzyl, benzhydryl, and triphenylmethyl acrylates have been imaged using high energy radiation (e.g., electron beam, X-ray, and ion beam) sources followed by development with aqueous alkaline solutions as described in Japanese Kokai applications 59-075244, and 58-068743.

Dimethylbenzyl methacrylates have been employed in combination with iodonium salts as deep-UV photoresists (Ito, H. *Polym. Mater. Sci. Eng.* 1989, 60, 142).

α-Substituted benzyl methacrylate polymers have been photoimaged and developed with an alkaline developer (Ito, H.; Ueda, M.; Ebina, M. *ACS Symp. Ser.* 1989, 412, 57–73).

Japanese Kokai applications 63-256492 and 63-317388 describe several direct-image lithographic plate formulations employing polymers having side-chain groups which, following an etching development step, cleave to form hydroxyl and carboxyl groups.

Japanese Kokai patent applications 53-094691 and 53-100192 describe lithographic plates containing polymers with acid labile groups including some alkoxyalkyl esters. The plates also contain cross-linking agents which appear to cross-link with carboxylic acid residues as they are formed. The plates appear to act in a negative-tone and may involve a development step.

Japanese Kokai application 62-299,313 describes the use of polymers containing acid anhydride residues in combination with o-nitrobenzyl esters of carboxylic acids. Those polymers are sensitive only to UV radiation.

U.S. Pat. No. 5,102,771 discloses photosensitive compositions comprising: (a) a photoinitiator which generates an acid upon exposure to radiation; and (b) a polymer having acid labile groups pendant from the polymer backbone. Those materials were combined with maleic anhydride polymers to provide increased adhesion. However, the resulting photosensitive compositions have only a moderate shelf-life under ambient conditions.

The photosensitive compositions of the present inventions require no wash off or thermal development step have superior shelf-life and press life and comparable speed to the prior compositions.

U.S. Pat. No. 5,077,174 (Bauer et al.) also discloses a positive working resist composition which comprises a polymer having acid-labile pendant groups of a defined formula.

SUMMARY OF THE INVENTION

The novel photosensitive compositions of the present invention comprise: (a) a photoinitiator which generates an acid upon exposure to radiation; and (b) a polymer having acid labile groups pendant from the polymer backbone, said pendant groups comprising at least one each of A and B wherein A has the formula —T—(C=O)OCR$^1$R$^2$OR$^3$, and B has the formula —T—(C=O)OR$^4$Si(R$^5$)$_3$, wherein R$^1$ and R$^2$ each represent H or an alkyl group (preferably with 1 to 18 carbon atoms) with the proviso that at least one of R$^1$ and R$^2$ must be hydrogen; R$^3$ represents an alky group (preferably with 1 to 18 carbon atoms); or any two of R$^1$, R$^2$, and R$^3$ may together form a ring group having from 3 to 36 carbon atoms; each R$^5$ independently represents an alkyl, aryl, alkoxy, trialkylsiloxy, aryloxy, or acyloxy group having up to 18 carbon atoms wherein at least one of R$^5$ is an alkoxy acyloxy, aryloxy, or trialkylsiloxy group; and R$^4$ and T independently represent a divalent linking group where T is bonded to the polymer backbone and R$^4$ is not bonded to the polymer backbone, e.g., which divalent group contains a total of from 0 carbon atoms (e.g., a covalent bond) or 1 to 18 carbon atoms where up to one of each three carbon atoms may be replaced by oxygen, nitrogen, or sulfur atoms or combinations thereof in the polymer backbone.

In another embodiment of the present invention, an imageable article is provided which comprises a substrate coated with the above-described photosensitive composition.

In still other embodiments of the present invention, processes for forming an imaged article are provided.

One inventive process involves the formation of an imaged article comprising exposing an imageable article (as disclosed herein earlier) to radiation within a range absorbed by the photoinitiator present in the imageable article to form a latent image bearing article and thereafter applying an aqueous solution and applying ink to the latent image bearing article, thereby forming an imaged article. An alternative to the above process involves contacting the latent image bearing article with a dye, instead of ink to form an imaged article.

Another inventive process for the formation of an imaged article comprises the steps of exposing an imageable article (as disclosed herein above) to a range absorbed by the photoinitiator present in the imageable article thereby forming a first latent image bearing article; contacting the first latent image bearing article with a hydrophilizing agent to form a second latent image bearing article; and thereafter, contacting the second latent image bearing article with a dye solution to form an imaged article. In an alternate embodiment to this process, the second latent image bearing article is contacted with ink, instead of a dye, to form an imaged article.

Also provided is a process for forming and fixing an imaged article comprising the steps of:
a) exposing an imageable article to radiation within a range absorbed by said photoinitiator to form a first latent bearing article;
b) heating said first latent image bearing article to a temperature greater than about 100° C. to form a second latent image bearing article, and
c) cooling said heated latent image bearing article to below 40° C. to form a third latent image bearing article, and
d) exposing said modified latent image bearing article to white light to form a fourth latent image bearing article, and
e) contacting said fourth latent image bearing article with hydrophilizing agent to form a fifth latent image bearing article, and
f) applying ink to said fifth latent image bearing article to form an imaged article.

The photosensitive compositions of the present invention do not have the previously discussed disadvantages and drawbacks associated with the use of conventional materials. Because the inventive compositions can be used in either self-developing processes or processes which require only neutral or mildly alkaline aqueous developing conditions, their use is more economical, efficient, and environmentally sound than the use of conventional printing plate materials.

DETAILED DESCRIPTION OF THE INVENTION

The photosensitive composition of the present invention comprises: (a) a photoinitiator which generates an acid upon exposure to radiation; and (b) a polymer having acid labile groups pendant from the polymer backbone, said pendant groups comprising at least one each of A and B wherein A has the formula $—T—(C=O)OCR^1R^2OR^3$, and B has the formula $—T—(C=O)OR^4Si(R^5)_3$, wherein $R^1$ and $R^2$ each represent H or an alkyl group with, for example, 1 to 18 carbon atoms with the proviso that at least one of $R^1$ and $R^2$ must be hydrogen; $R^3$ represents an alkyl group with, for example, 1 to 18 carbon atoms; or any two of $R^1$, $R^2$, and $R^3$ may together form a ring having from 3 to 36 carbon atoms. With regard to $R^1$, $R^2$, and $R^3$, preferred alkyl groups are methyl and ethyl. Preferred ring structures are furanyl, pyranyl, and oxabicyclooctyl. $R^5$ represents an alkyl, aryl, acyloxy, alkoxy, or trialkylsiloxy group having from up to 18 carbon atoms. Preferably, $R^5$ is alkyl, alkoxy, or trialkylsiloxy having up to 6 carbon atoms. Most preferably, $R^5$ is a methyl, ethyl, isopropyl, phenyl, methoxy, ethoxy, or trimethylsiloxy group; and $R^4$ and T each independently represent a divalent linking group T bonded to the polymer backbone and $R^4$ not bonded to the polymer backbone, and each contains a total of from 0 (a covalent bond) or 1 to 18 carbon atoms where up to one of each three carbon atoms in the polymer backbone may be replaced by oxygen, nitrogen, or sulfur atoms or combinations thereof. Preferably, $R^4$ and T should contain no functional groups which are more basic than an alkoxyalkyl ester moiety, as employed in the present invention. Representative examples of such functional groups (which are more basic than the alkoxyalkyl ester moiety) include, but are not limited to, amines, alkoxides, sulfides, amides, urethanes, imides, etc. Non-limiting examples of $R^4$ and T include a direct carbon-carbon bond to the polymer backbone are hydrocarbon diyls and oxydiyls, particularly alkanediyls and oxydiyls such as methylidene, 1,3-propanediyl, 1,5-pentanediyl, 2-oxopropanediyl, phenylene (an arenediyl), and the like. Preferably T is a direct carbon-carbon bond (i.e., T has no atoms). Preferably $R^4$ is 1,3-propanediyl (i.e., $—CH_2CH_2CH_2—$).

The polymers of the present invention are preferably derived from any non-basic (i.e., not containing 1°, 2°, or 3° amines or phosphines) polymer backbone, and may be prepared by any of the known in the art methods for preparing polymers (such as free radical, anionic, addition, condensation, and cationic polymerization). Non-limiting examples of non-basic polymer backbones are polyacrylates, polymethacrylates, polystyrenes, acrylonitrile-styrene copolymers, butadiene-styrene copolymers, polyolefins (e.g. polyethylene, polypropylene, polyisobutylene, etc.), polyesters, polyethers, polycarbonates, polysulfides, and the like. Examples of basic polymer backbones are those containing 1°, 2°, or 3° amines or phosphines; or 1° or 2° amides. Preferred polymer backbones are derived from free radical polymerized polymers. Particularly preferred polymer backbones are polyacrylates and polymethacrylates. Additionally, it may be desirable in some applications that the polymer matrix be cross-linked, while in other instances it may be preferable that there be no cross-linking.

Alkoxyalkyl ester moieties may be either incorporated within monomer units prior to polymerization or attached to already formed polymer backbones using methods well known in the chemical arts. For example, in cases in which an active hydrogen atom is present on the polymer backbone (for example, $—OH$, $—C(=O)CH_2C(=O)—$, $—SH$, and the like), deprotonation with a strong base (such as sodium hydride, lithium diisopropylamide, potassium t-butoxide, or any other base having sufficient strength to abstract the active hydrogen atom), followed by condensation with alkoxyalkyl ester moieties having reactive groups such as epoxy, haloacyl, carboxyalkyl, and the like may be used to prepare the polymers of the present invention. In cases in which olefinic unsaturation is present, alkoxyalkyl ester moieties having alkenyl substituents may be added by reactions such as Dieis-Alder 4+2 thermal cyclo additions or 2+2 photocycloaddition. In still other cases in which no recognized functionality is present (e.g., polyethylene, polypropylene, etc.), one may corona treat or otherwise oxidize said polymer to provide active hydrogen sites on the polymer backbone.

Preferably, the alkoxyester moiety is incorporated in a monomer or comonomer unit.

The photoinitiator used herein is one which generates acid upon exposure to radiation. Many such substances are known in the photoimaging art including, but not limited to, various onium compounds (e.g., sulfonium, iodonium, diazonium, etc.; particularly aryl derivatives thereof), and various organic compounds with photolabile halogen atoms (α-halo-p-nitrotoluenes, α-halomethyl-s-triazines, carbon tetrabromide, etc.).

In a preferred embodiment, the photoinitiator is a substituted or unsubstituted diaryliodonium salt generally described by the formulae:

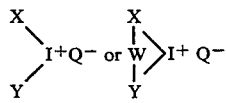

wherein X and Y are aryl groups (which may or may not be substituted with a total of from 4 to 20 carbon atoms (e.g., substituted or unsubstituted phenyl, naphthyl, thienyl, and furanyl). W is selected from the group consisting of a carbon-carbon bond; oxygen; sulfur; or an acyl group (e.g., 2 to 20 carbon atoms), or $R^7$—C—$R^8$ wherein $R^7$ and $R^8$ are individually selected from hydrogen, alkyl groups of 1 to 4 carbon atoms, and alkenyl groups of 2 to 4 carbon atoms; and $Q^-$ is any anion capable of forming a stable salt with diphenyliodonium cation at room temperature, for example, the anion must have a $pK_a$ less than 16, and an oxidation potential of greater than 0.7 V. Preferred anions $Q^-$ are complex halogenated metal anions such as hexafluorophosphate, hexafluoroantimonate, hexafluoroarsenate; borates such as tetrafluoroborate and tetraphenylborate. Particularly preferred anions are hexafluorophosphate, hexafluoroantimonate, hexfluoroarsenate, and tetrafluoroborate.

Non-limiting examples of suitable iodonium salts are salts of diphenyliodonium, dinaphthyliodonium, di(4-chlorophenyl)iodonium, tolyl(dodecylphenyl)iodonium, naphthylphenyliodonium salts, 4-(trifluoromethylphenyl)phenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, and the like. Diphenyliodonium salts are preferred.

The photolyzable organic halogen compounds which are useful in the present invention are those that upon exposure to radiation dissociate at one or more carbon-halogen bonds to form free radicals. The carbon-halogen bond dissociation energy should be between about 40 and 70 kcal/mole as taught in U.S. Pat. No. 3,515,552. Preferred photolyzable organic halogen compounds have from 1 to 40 carbon atoms, are non-gaseous at room temperature, and have a polarographic half-wave reduction potential greater than about −0.9 V as described in U.S. Pat. Nos. 3,640,718 and 3,617,288.

Examples of photolyzable organic halogen compounds are hexabromoethane, α,α,α',α'-tetrabromoxylene, carbon tetrabromide, m-nitro(tribromoacetyl)benzene, α,α,α-trichloroacetanilide, trichloromethylsulfonylbenzene, tribromoquinaldine, bis(pentachlorocyclopentadiene), tribromomethylquinoxaline, e,e-dibromo-p-nitrotoluene, α,α,α,α',α',α'-hexachloro-p-xylene, dibromotetrachloroethane, pentabromoethane, dibromodibenzoylmethane, carbon tetraiodide, halomethyl-s-triazines such as 2,4-bis(trichloromethyl)-6-methyl-s-triazine, 2,4,6-tris(trichloromethyl)-s-triazine, and 2,4-bis(trichloromethyl)-6-(p-methoxystyryl)-s-triazine, etc.

The iodonium salts or photolyzable organic halogen compounds employed in the present invention may be either exposed to ultraviolet radiation or sensitized into the visible spectrum. Wavelengths between 250 nm and 900 nm inclusive may be used. Compounds useful as sensitizing dyes of this invention include, but are not limited to, aryl nitrones, xanthenes, anthraquinones, substituted diaryl- and triarylmethanes, methines, merocyanines, and polymethines, thiazoles, substituted and unsubstituted polycyclic aromatic hydrocarbons such as e.g., dialkoxy anthracenes, and pyrylium dyes.

In some instances it is desirable to add at least one additional polymer to the photosensitive compositions of the present invention. The polymers may generate additional hydrophilic functionality upon exposure to light and treatment with aqueous solutions, and serve to increase the differential in wettability between the exposed and unexposed regions of the photosensitive composition. Hydrophobic polymers may be added to increase durability or adhesion. The additional polymer may be present in amounts up to 90 percent by weight, preferably at least 1% and not more than 50 percent.

Additionally, it may be desirable to treat the photosensitive compositions of the present invention with at least one hydrophilizing agent subsequent to exposure. Hydrophilizing agents are generally applied as aqueous solutions having a pH in the range of 7–10. Suitable hydrophilizing agents increase the wettability in exposed regions without affecting the wettability in unexposed regions of the photosensitive composition, thereby increasing the differential in wettability between exposed and unexposed regions. Preferably, the hydrophilizing agent is a basic material. Most preferably, the basic material is an 1°, 2°, 3°, or 4° amine-substituted sulfonic acid or its salt having from 2 to 18 carbon atoms (e.g., 4-morpholinepropanesulfonic acid, β-hydroxy-4-morpholinepropanesulfonic acid salt, 4-morpholineethanesulfonic acid, sodium 4-morpholinepropanesulfonate, sodium cysteate, aminotris(hydroxymethyl)methane, etc ), an 1°, 2°, 3°, or 4° amine-substituted alcohol (e.g., tetrakis(2-hydroxyethyl)ethylenediamine, 2-amino-1,3-propanediol, triethanolamine, or their acid salts, etc.) or an amine-substituted carboxylic acid (e.g., glycine, alanine, 3-dimethylaminopropanoic acid, etc.). The method of treatment is not critical and may be accomplished, for example, by wiping or spraying the hydrophilizing agent onto the exposed plate, or by dipping the exposed plate into a solution of the hydrophilizing agent, or by means of a fountain solution when used on a press. Additionally, an acid-base indicator dye can be added to the formulation. This can serve to give the plate a color initially as well as to give a printout image upon image-wise exposure. A further advantage of having visible dye present is that it tends to increase the handling time under ambient lighting conditions before the plate becomes over exposed.

The photosensitive compositions of the present invention are generally coated onto a substrate prior to use in an imaging application. Coating may be achieved by many methods well known in the imaging art (e.g., solvent casting, knife coating, extrusion, etc.). Suitable substrates on which the compositions of the present invention may be supported include, but are not limited to, metals (e.g., steel and aluminum plates, sheets, and foils); films or plates composed of various film-forming synthetic or high polymers including addition polymers (e.g., polyvinylidene chloride, polyvinyl chloride, polyvinyl acetate, polystyrene, polyisobutylene polymers and copolymers), and linear condensation polymers (e.g., polyethylene terephthalate, polyhexamethylene adipate, polyhexamethylene adipamide/adipate); nonwoven wood by-product based substrates such as paper and cardboard including aluminized papers; and glass. Substrates may be transparent or opaque.

The photosensitive compositions of the present invention may contain various materials in combination with the essential ingredients of the present invention. For example, plasticizers, coating aids, antioxidants, surfactants, antistatic agents, waxes, ultraviolet radiation absorbers, and brighteners may be used without adversely affecting the practice of the invention. The various materials should preferably not contain functional groups which are more basic than alkoxyalkyl ester employed in the present invention (e.g., free amines, alkoxides, sulfides, amides, urethanes, imides, etc.) as defined above, in a molar amount higher than the molar amount of photoacid precursor.

One process of the invention involves the formation of an imaged article comprising exposing an imageable article (as disclosed herein earlier) to radiation within a range absorbed by the photoinitiator present in the imageable article to form a latent image bearing article and thereafter simultaneously or sequentially applying an aqueous solution, applying ink to the latent image bearing article, thereby forming an imaged article. An alternative to the above process involves contacting the latent image bearing article with a dye, instead of ink to form an imaged article.

Another inventive process for the formation of an imaged article comprises the steps of exposing an imageable article (as disclosed herein above) to a range absorbed by the photoinitiator present in the imageable article thereby forming a first latent image bearing article; contacting the first latent image bearing article with a hydrophilizing agent to form a second latent image bearing article; and thereafter, contacting the second latent image bearing article with a dye solution to form an imaged article. In an alternate embodiment to this process, the second latent image bearing article is contacted with ink, instead of a dye, to form an imaged article.

Additionally, an ammonium salt can be added to the formulation. This provides for a process for fixing an imaged article comprising the steps:
a) exposing an imageable article to radiation within a range absorbed by said photoinitiator to form a first latent image bearing article;
b) heating said first latent image bearing article to a temperature greater than about 100° C. to form a second latent image-bearing article;
c) cooling said heated latent image bearing article to below 40° C. to form a third latent image bearing article;
d) exposing said modified latent image bearing article to white light to form a fourth latent image bearing article;
e) contacting said fourth latent image bearing article with hydrophilizing agent to form a fifth latent image bearing article; and
f) applying ink to said fifth latent image bearing article to form an imaged article.

Alternatively, the addition of an ammonium salt gives a wash off system by the following process:
a) exposing an imageable article to radiation within a range absorbed by said photoinitiator to form a first latent image-bearing article; and
b) contacting said first latent image-bearing article with a hydrophilizing agent to form an imaged article.

The following non-limiting examples further illustrate the present invention.

EXAMPLES

The materials employed below were obtained from Aldrich Chemical Co. (Milwaukee, Wis.) unless otherwise specified. All silanes were obtained from Hüls Petrarch systems (Bristol, Pa.).

Materials were analyzed by one or more of the following techniques $^1$H NMR, infrared, and mass spectroscopy; gel phase chromatography; and differential scanning calorimetry.

The term "MEK" means methyl ethyl ketone.

Aluminum plates used for coatings in the following experiments were cleaned, degreased lithograde alloy, brush grained, electrochemically grained, anodized aluminum sheets. Exposures were conducted using a Berkey Ascor vacuum frame exposure unit (Berkey Technical Co., Woodside, N.Y.) equipped with a 2 kW Ascor Addalux Lamp No. 1406-01. A neutral density 21 step (0.15 absorbance units/step) sensitivity guide (Stouffer Graphic Arts Equipment Co., South Bend, Ind.) was used to measure the photosensitivity of the coatings prepared below.

The term solid step as used below refers to the highest numbered step which is completely dyed by the dye solution. The term open step refers to the highest numbered step which is completely free of ink after inking of the imaged plate. Hand Rub-Up TM Ink U-62 (Printing Development, Inc., Racine, Wis.) was used to ink plates described below. Primed polyester film used in the following examples is described in U.S. Pat. No. 4,335,220.

EXAMPLE 1

This example describes the synthesis of THP-methacrylate/MATS Copolymer.

A solution of 100 grams THP-methacrylate, 10 grams methacryloxypropyltrimethoxysilane (MATS), and 1.93 grams azobis(isobutyronitrile) in 100 mL MEK was heated to 70° C. for four hours. To the reaction mixture was added 583 mL MEK to give a solution of THP-methacrylate MATS copolymer at 17 wt. % solids. This solution was used directly in the following formulations.

EXAMPLE 2

This example describes the isolation of THP-methacrylate/MATS copolymer.

To an 80 mL portion of the copolymer solution prepared in Example 1 above was added 80 mL of MEK. This mixture was poured into 1 liter of methanol to precipitate the THP-methacrylate/MATS copolymer. The copolymer precipitated as a white solid and was collected and dried; 10.8 grams (80% recovery).

EXAMPLE 3

This example describes the preparation and evaluation of printing plates using the THP-methacrylate/MATS copolymers of the present invention.

Printing plate samples were prepared with the formulations given below. There were two levels of coating weights evaluated. The "low coating weight" samples were approximately 50 to 70 mg/ft$^2$ coating weight, and the "high coating weight" samples were approximately 180 to 200 mg/ft$^2$ coating weight. These solutions were coated on electrochemically-grained anodized aluminum, coated with a #4 (low coating weight solutions) or a #10 (high coating weight solutions) Mayer bar. The samples were heated to 93° C. for 2 minutes. The coated samples gave a blue color due to the presence of ethyl violet. Upon exposure the dye turned yellow in the light struck areas to give a positive printout image.

After a 100–300 unit exposure in a 5 kW vacuum frame through a sensitivity guide, a positive blue printout image was obtained. At this point the plate was stable to ambient room light for several hours. The samples were then either hand inked or put on press for evaluation. The fountain solutions used are shown below. The fountain solution should not have a pH less than 6. The plates were swabbed with fountain solution before rollup and functioned on press as standard positive acting printing plates with approximately the same ink-water balance as for a positive PLX plate (Diaprint/3M S.p.A., Sulmona, Italy). The printing presses used for evaluation of the printing plate samples employed integrated and non-integrated dampening (i.e., Heidelberg, ATF Chief 15, and Ryobi 3200).

Coating Formulations

High Coating Weight 190 mg/ft$^2$ (HCW):

A high coating weight solution (16%) was prepared by combining 6.91 grams THP-methacrylate/MATS copolymer from Example 1 (17% solution in MEK, 1.17 grams), 0.27 grams diphenyliodonium hexafluorophosphate, 0.13 grams anthracene, 0.007 grams Ethyl Violet (as a 0.374 wt % solution in MEK), and 0.80 grams MEK.

Another high coating weight solution (14% solids) was prepared by combining 1.03 grams THP-methacrylate/MATS copolymer from Example 2, 0.24 grams diphenyliodonium hexafluorophosphate, 0.12 grams anthracene, and 0.006 grams Ethyl Violet (as a 0,374 wt % solution in MEK).

Low Coating Weight 55 mg/sq ft (LCW):

A low coating weight solution (10 wt % solids) was prepared by combining 10.0 grams THP-methacrylate/MATS copolymer from Example 1 (17% solution in MEK, 1.70 grams), 0.40 grams diphenyliodonium hexafluorophosphate, 0.20 grams anthracene, 0.010 grams Ethyl Violet (as a 0.374 wt % solution in MEK), and 9.85 grams MEK.

Another low coating weight solution (10 wt % solids) was prepared by combining 0.73 grams THP-methacrylate/MATS copolymer from Example 2, 0.17 grams diphenyliodonium hexafluorophosphate, 0.087 grams anthracene, and 0.0087 grams Ethyl Violet (as a 0.374 wt % solution in MEK).

Fountain Solutions

A pH=7.02 fountain solution was prepared by combining 20 grams morpholineethanesulfonic acid (MES), 697 grams water, 30.8 grams 10 wt % aqueous sodium hydroxide solution, and 83 grams isopropyl alcohol.

A pH=8.91 fountain solution was prepared by combining 40 grams triethanolamine, 680 grams water, 2.7 grams 36 wt % aqueous HCl solution, and 80 grams isopropyl alcohol.

Evaluation

The observed photo-speed for the plate formulations described above varied due to variations in the substrate, length of time between exposure and inking, age of plate, source of copolymer (i.e., solution or isolated) and formulation. The general range of speeds obtained for these systems are given below. The Gray Scale Response is on a Stouffer 21 step scale and the steps are ghost-solid steps.

|  | Fountain | Exposure | Gray Scale Response |
|---|---|---|---|
| low coating | pH 7.02 | 300 units | 3–5 steps |
| weight | pH 8.91 | 300 units | 3–9 steps |
| high coating | pH 7.02 | 300 units | 7–9 steps |
| weight | pH 8.91 | 300 units | 5–10 steps |

EXAMPLE 4

This example describes the preparation of a THP-methacrylate copolymer with 3-methacryloxypropyltris-(trimethylsiloxy)silane.

A solution of 5.0 grams THP-methacrylate and 0,857 grams 3-methacryloxypropyltris(trimethylsiloxy)silane in 5.0 mL of MEK was heated with 0.096 grams of azobis(isobutyronitrile) (AIBN) to 70° C. for 4 hours, and 29.0 mL of MEK was added to give a 17% solution of the copolymer in MEK.

The polymer was precipitated from the MEK solution by adding 0.85 mL of a 17% solution to 5 Ml of MeOH. In this manner 3.25 grams of the precipitated polymer was collected.

EXAMPLE 5

This example describes the preparation of a copolymer of THP-methacrylate with 3-methacryloxypropylmethyldiethoxysilane.

A solution of 10.0 grams THP-methacrylate and 1.056 grams 3-methacryloxypropylmethyldiethoxysilane in 10.0 mL of MEK was heated with 1.056 grams of AIBN to 70° C. for 4 hours and 56.0 mL of MEK was added to give a 17% solution of the copolymer in MEK.

The polymer was precipitated from the MEK solution by adding 73 mL of a 17% solution to 730 mL of MeOH. In this manner 8.9 grams of the precipitated polymer was collected.

EXAMPLE 6

This example describes the preparation of a copolymer of THP-methacrylate with 3-methacryloxypropylpentamethyldisiloxane.

A solution of 10.0 grams THP-methacrylate and 1.113 grams 3-methacryloxypropylpentamethyldisiloxane in 10.0 mL MEK was heated with 0.193 grams AIBN to 70° C. for 3.5 hours and 56.0 mL of MEK was added to give a 17% solution of the copolymer in MEK.

The polymer was precipitated from the MEK solution by adding 75 mL of a 17% solution to 750 mL of MeOH. In this manner 7.9 grams of the precipitated polymer was collected.

EXAMPLE 7

This example describes the preparation of a THP-methacrylate copolymer with 3-methacryloxypropyldimethylethoxysilane.

A solution of 10.0 grams THP-methacrylate and 0.93 grams 3-methacryloxypropyldimethylethoxysilane in 10.0 mL MEK was heated with 0.193 grams AIBN to 70° C. for 3.0 hours, and 56.0 mL MEK was added to give a 17% solution of the copolymer in MEK.

The polymer was precipitated from the MEK solution by adding 72 mL of a 17% solution to 720 mL of MeOH. In this manner 7.75 grams of the precipitated polymer was collected.

The copolymers from Examples 4–7 were evaluated by using the corresponding polymer solutions as described in Examples 4 through 7 by using the following formulation.

Coating solutions were prepared from the polymer solutions prepared in Examples 4–7 by combining 1.17 grams copolymer solution from (17% solution in MEK), 0.087 grams diphenyliodonium hexafluorophosphate, 0,044 grams anthracene, 0.002 grams Ethyl Violet (as a 0.37 wt % solution in MEK).

Four plates corresponding the four samples were coated with a #8 Mayer bar and heated to 90° C. for 2 minutes, exposed in a 2 kW Berkey Ascor exposure unit, and swabbed with a 2.5% solution of MES (pH 7.1) and inked.

Fountain solution used was 2.5% MES aqueous adjusted to a pH 7.1 with 10 wt % aqueous sodium hydroxide.

| Polymer from Example | Exposure (seconds) | Steps |
| --- | --- | --- |
| 4 | 20 | 6 |
| 5 | 20 | 4 |
| 6 | 20 | 8 |
| 7 | 10 | 5 |

Plate samples made with these copolymers were stable for 3 days at 60° C. and 80% relative humidity.

In the technical area of the present invention, there is substantial background in the art which allows for many variations in substitutions on compounds used in the practice of the invention. To indicate this art recognized acceptance of substitution, the following nomenclature is used in describing compounds and their substituents. Where the term "group" is used to describe a chemical species, as in alkyl group, aryl group, heterocyclic group, or imidazole group, that terminology is specifically intended to include both substituted and unsubstituted species. For example, an alkyl group would include all unsubstituted alkyl structures such as methyl, ethyl, propyl, hexyl, iso-octyl, dodecyl, etc., and would also include alkyl structures with substitution thereon such as hydroxymethyl, 2-chloroethyl, 3-carboxypropyl, 6-ethoxyethyl, perfluorododecyl, and the like. All conventional substitutions, as understood in the relevant art, are allowed on the central structure (e.g., alkyl) and are included within the term 'group.' Where the term "alkyl" or "alkyl moiety" is used without calling it a group, that term allows for only the strict chemical structure to be included within the term. For example, aryl covers only phenyl, naphthyl, and other aromatic rings without exocyclic substitution thereon. Aryl group on the other hand allows for any conventional substitution on the aryl ring. As the invention is practiced within an art recognized field, this type of substitution and the contemplated scope of that substitution is well understood.

What is claimed is:

1. A process for formation of an imaged article comprising exposing an imageable article comprising a substrate coated with a photosensitive composition comprising (a) a photoinitiator which generates an acid upon exposure to radiation; and (b) a polymer having acid labile groups pendant from the polymer backbone, said acid labile pendant groups comprising at least one each of A and B, wherein B has the formula —T—(C=O)OR$^4$ Si(R$^5$)$_3$, and A has the formula —T—(C=O)OCR$^1$R$^2$OR$^3$, wherein R$^1$ and R$^2$ each represent H or an alkyl group with the proviso that at least one of R$^4$ and R$^2$ must be hydrogen; R$^3$ represents an alkyl group; or any two of R$^1$, R$^2$, and R$^3$ may together form a ring having from 3 to thirty-six carbon atoms; R$^5$ represents an alkyl group, an aryl group, an alkoxy group, an aryloxy group, an dcyloxy group, or a trialkylsiloxy group; and R$^4$ and T independently represent a carbon-to-carbon bond or a divalent linking group wherein T is bonded to the polymer backbone and R$^4$ is not bonded to the polymer backbone to radiation within a range absorbed by the photoinitiator to form a latent image bearing article and thereafter, applying an aqueous solution and ink to the latent image bearing article.

2. A process for the formation of an imaged article comprising the steps of exposing an imageable article comprising a substrate coated with a photosensitive composition comprising (a) a photoinitiator which generates an acid upon exposure to radiation; and (b) a polymer having acid labile groups pendant from the polymer backbone, said acid labile pendant groups comprising at least one each of A and B, wherein B has the formula —T—(C=O)OR$^4$ Si(R$^5$)$_3$, and A has the formula —T—(C=)OCR$^1$R$^2$OR$^3$, wherein R$^1$ and R$^2$ each represent H or an alkyl group with the proviso that at least one of R$^1$ and R$^2$ must be hydrogen; R$^3$ represents an alkyl group; or any two of R$^1$, R$^2$, and R$^3$ may together form a ring having from 3 to thirty-six carbon atoms; R$^5$ represents an alkyl group, an aryl group, an alkoxy group, an aryloxy group, an acyloxy group, or a trialkylsiloxy group; and R$^4$ and T independently represent a carbon-to-carbon bond or a divalent linking group wherein T is bonded to the polymer backbone and R$^4$ is not bonded to the polymer backbone, to a range of radiation absorbed by the photoinitiator thereby forming a latent image bearing article; contacting the first latent image bearing article with a hydrophilizing agent to form a second latent image bearing article; and then contacting the second latent image bearing article with a dye solution to form an imaged article.

3. A process for formation of an imaged article comprising the steps of exposing an imageable article comprising a substrate coated with a photosensitive composition comprising (a) a photoinitiator which generates an acid upon exposure to radiation; and (b) a polymer having acid labile groups pendant from the polymer backbone, said acid labile pendant groups comprising at least one each of A and B, wherein B has the formula —T—(C=O)OR$^4$ Si(R$^5$)$_3$, and A has the formula —T—(C=O)OCR$^1$R$^2$OR$^3$, wherein T is a carbon-to-carbon bond, R$^4$ is 1,3-propanediyl, R$^1$ is H, R$^2$ is alkyl of 1 or 2 carbon atoms, and R$^3$ is alkyl of 1 or 2 carbon atoms and T is bonded to the polymer backbone and R$_4$ is not bonded to the polymer backbone to a range of radiation absorbed by the photoinitiator thereby forming a first latent image bearing article; contacting the first latent image bearing article with a hydrophilizing agent to form a second latent image bearing article; and then contacting the second latent image bearing article with a dye solution to form an imaged article.

4. A process for forming and fixing an imaged article comprising the steps of:
   a) exposing an imageable article comprising a substrate coated with a photosensitive composition comprising (a) a photoinitiator which generates an acid upon exposure to radiation; and (b) a polymer having acid labile groups pendant from the polymer backbone, said acid labile pendant groups comprising at least one each of A and B, wherein B has the formula —T—(C=O)OR$^4$ Si(R$^5$)$_3$, and A has the formula —T—(C=O)OCR$^1$R$^2$OR$^3$, wherein R$^1$ and R$^2$ each represent H or an alkyl group with the proviso that at least one of R$^1$ and R$^2$ must be hydrogen R$^3$ represents an alkyl group; or any two of R$^1$, R$^2$, and R$^3$ may together form a ring having from 3 to thirty-six carbon atoms; R$^5$ represents an alkyl group, an aryl group, an alkoxy group, an aryloxy group, an acyloxy group, or a trialkylsiloxy group; and R$^4$ and T independently represent a carbon-to-carbon bond or a divalent linking group wherein T is bonded to the polymer backbone and R$^4$ is not bonded to the polymer backbone, to radiation within a range absorbed by said photoinitiator to form a first latent image bearing article;
   b) heating said first latent image bearing article to a temperature greater than about 100° C. to form a second latent image bearing article, and
   c) cooling said heated latent image bearing article to below 40° C. to form a third latent image bearing article, and
   d) exposing said modified latent image bearing article to white light to form a fourth latent image bearing article, and
   e) contacting said fourth latent image bearing article with hydrophilizing agent to form a fifth latent image bearing article, and
   f) applying ink to said fifth latent image bearing article to form an imaged article.

5. A process for forming and fixing an imaged article comprising the steps of:
   a) exposing an imageable article comprising a substrate coated with a photosensitive composition comprising (a) a photoinitiator which generates an acid upon exposure to radiation; and (b) a polymer having acid labile groups pendant from the polymer backbone, said acid labile pendant groups comprising at least one each of A and B, wherein B has the formula —T—(C=O)OR$^4$ Si(R$^5$)$_3$, and A has the formula —T—(C=O)OCR$^1$R$^2$OR$^3$, wherein T is a carbon-to-carbon bond, R$^4$ is 1,3-propanediyl, R$^2$ is alkyl of 1 or 2 carbon atoms, and R$^3$ is alkyl of 1 or 2 carbon atoms and T is bonded to the polymer backbone and R$_4$ is not bonded to the polymer backbone to radiation within a range absorbed by said photoinitiator to form a first latent image bearing article;
   b) heating said first latent image bearing article to a temperature greater than about 100° C. to form a second latent image bearing article, and
   c) cooling said heated latent image bearing article to below 40° C. to form a third latent image bearing article, and
   d) exposing said modified latent image bearing article to white light to form a fourth latent image bearing article, and
   e) contacting said fourth latent image bearing article with hydrophilizing agent to form a fifth latent image bearing article, and
   f) applying ink to said fifth latent image bearing article to form an imaged article.

6. The process of claim 1 wherein R$^4$ is selected from the group consisting of carbon-to-carbon bond, alkanediyl, oxoalkanediyl, and arenediyl.

7. The process of claim 6 wherein T is selected from the group consisting of carbon-to-carbon bond, alkanediyl, oxoalkanediyl, and arenediyl.

8. The process of claim 1 wherein T is a carbon-to-carbon bond, R$^4$ is 1,3-propanediyl, R$^1$ is H, R$^2$ is alkyl of 1 or 2 carbon atoms, and R$^3$ is alkyl of 1 or 2 carbon atoms.

* * * * *

UNITED STATES PATENT AND TRADEMARK OFFICE
CERTIFICATE OF CORRECTION

PATENT NO. : 5,395,734
DATED : March 7, 1995
INVENTOR(S) : Vogel et al.

It is certified that error appears in the above-indentified patent and that said Letters Patent is hereby corrected as shown below:

Column 5, line 6, delete "cyclo additions"
  and insert --cycloadditions--.

Column 6, lines 8-9, delete "e,e-dibromo-p-nitrotoluene,"
  and insert --α,α-dibromo-p-nitrotoluene,--.

Column 9, line 59, delete "0,374"
  and insert --0.374--.

UNITED STATES PATENT AND TRADEMARK OFFICE
CERTIFICATE OF CORRECTION

PATENT NO. : 5,395,734
DATED : March 7, 1995
INVENTOR(S) : Vogel et al.

It is certified that error appears in the above-indentified patent and that said Letters Patent is hereby corrected as shown below:

Column 11, line 31, delete "0,044"
   and insert --0.044--.

Column 12, line 28, delete "dcyloxy"
   and insert --acyloxy--.

Column 13, line 32, delete "hydrogen $R^3$"
   and insert --hydrogen; $R^3$--.

Column 14, line 21, delete "$R^4$"
   and insert --$R^1$--.

Signed and Sealed this

Fourteenth Day of May, 1996

Attest:

BRUCE LEHMAN

*Attesting Officer*          *Commissioner of Patents and Trademarks*